United States Patent
Yeh (10) Patent No.: US 9,118,141 B2
(45) Date of Patent: Aug. 25, 2015

(54) RETENTION DEVICE AND ELECTRICAL CONNECTOR ASSEMBLY USED THEREOF

(71) Applicant: HON HAI PRECISION INDUSTRY CO., LTD., New Taipei (TW)

(72) Inventor: Cheng-Chi Yeh, New Taipei (TW)

(73) Assignee: HON HAI PRECISION INDUSTRY CO., LTD., New Taipei (TW)

( * ) Notice: Subject to any disclaimer, the term of this patent is extended or adjusted under 35 U.S.C. 154(b) by 85 days.

(21) Appl. No.: 14/054,860

(22) Filed: Oct. 16, 2013

(65) Prior Publication Data

US 2014/0106605 A1 Apr. 17, 2014

(30) Foreign Application Priority Data

Oct. 16, 2012 (TW) .............................. 101138121 A (51) Int. Cl.
*H01L 23/40* (2006.01)
*H01R 13/533* (2006.01)
*H05K 7/10* (2006.01)

(52) U.S. Cl.
CPC .............. *H01R 13/533* (2013.01); *H01L 23/40* (2013.01); *H01L 23/4093* (2013.01); *H05K 7/1053* (2013.01); *H01L 2924/0002* (2013.01)

(58) Field of Classification Search
CPC . H01R 13/533; H05K 7/1053; H01L 23/4093
USPC ............ 439/73, 331, 485, 487; 361/709, 710, 361/704, 719; 165/185, 80.2, 80.3
See application file for complete search history.

(56) References Cited

U.S. PATENT DOCUMENTS

| | | | | |
|---|---|---|---|---|
| 4,502,747 A | * | 3/1985 | Bright et al. | 439/296 |
| 5,302,853 A | * | 4/1994 | Volz et al. | 257/707 |
| 5,357,404 A | * | 10/1994 | Bright et al. | 361/818 |
| 6,205,026 B1 | * | 3/2001 | Wong et al. | 361/704 |
| 6,390,475 B1 | * | 5/2002 | Eckblad et al. | 277/312 |
| 6,510,054 B1 | * | 1/2003 | Chen | 361/704 |
| 6,538,891 B1 | * | 3/2003 | He et al. | 361/704 |
| 6,574,109 B1 | * | 6/2003 | McHugh et al. | 361/719 |
| 6,639,800 B1 | * | 10/2003 | Eyman et al. | 361/704 |
| 6,731,505 B1 | * | 5/2004 | Goodwin et al. | 361/719 |
| 6,758,692 B2 | * | 7/2004 | Walkup et al. | 439/485 |
| 6,776,641 B2 | * | 8/2004 | Hachuda | 439/331 |
| 6,826,052 B2 | | 11/2004 | Ma | |
| 6,942,506 B2 | * | 9/2005 | Kimura et al. | 439/159 |
| 6,970,354 B2 | * | 11/2005 | Villanueva et al. | 361/679.54 |
| 7,001,197 B2 | * | 2/2006 | Shirai et al. | 439/331 |
| 7,019,978 B2 | * | 3/2006 | Zhou et al. | 361/704 |

(Continued)

FOREIGN PATENT DOCUMENTS

CN 2313241 Y 4/1999

*Primary Examiner* — David M Sinclair
*Assistant Examiner* — Robert Brown
(74) *Attorney, Agent, or Firm* — Wei Te Chung; Ming Chieh Chang (57) ABSTRACT

A retention device (2) for positioning a heat sink (3) includes a base (21), a lever (22) and a pressing tab (23), the pressing tab (23) includes a first pushing portion (233) and a second pushing portion (232) for pressing the heat sink (3), the first pushing portion (233) includes an upper surface (2330) and a lower surface opposite (2331) to the upper surface (2330), the second pushing portion (232) includes a top surface (2320) and a bottom surface (2321) opposite to the top surface (2320), the distance between the upper surface (2330) and the lower surface (2331) is smaller than the distance between the top surface (2320) and the bottom surface (2321).

14 Claims, 7 Drawing Sheets

(56) References Cited

U.S. PATENT DOCUMENTS

| | | | |
|---|---|---|---|
| 7,083,456 B2* | 8/2006 | Trout et al. | 439/326 |
| 7,133,285 B2* | 11/2006 | Nishimura | 361/715 |
| 7,153,154 B2* | 12/2006 | Ma et al. | 439/331 |
| 7,203,066 B2* | 4/2007 | Lee et al. | 361/704 |
| 7,280,362 B2* | 10/2007 | Hood et al. | 361/719 |
| 7,283,362 B2* | 10/2007 | Lin et al. | 361/704 |
| 7,327,575 B2* | 2/2008 | Yu et al. | 361/719 |
| 7,385,823 B1* | 6/2008 | Desrosiers et al. | 361/710 |
| 7,388,751 B2* | 6/2008 | Hood et al. | 361/704 |
| 7,493,937 B2* | 2/2009 | Chen et al. | 165/80.2 |
| 7,667,972 B2* | 2/2010 | Chen et al. | 361/709 |
| 7,677,912 B2* | 3/2010 | Zhang | 439/331 |
| 7,690,926 B2* | 4/2010 | Yeh et al. | 439/73 |
| 7,699,637 B2* | 4/2010 | Yeh | 439/331 |
| 7,708,585 B2* | 5/2010 | Yeh et al. | 439/489 |
| 7,744,397 B2* | 6/2010 | Yeh et al. | 439/331 |
| 7,746,652 B2* | 6/2010 | Horng et al. | 361/719 |
| 7,766,691 B2* | 8/2010 | Pandey et al. | 439/487 |
| 7,773,384 B2* | 8/2010 | Lin et al. | 361/719 |
| 7,824,188 B2* | 11/2010 | Yokoyama | 439/73 |
| 7,826,229 B2* | 11/2010 | Cromwell et al. | 361/719 |
| 7,828,577 B2* | 11/2010 | Yeh | 439/331 |
| 7,841,883 B2* | 11/2010 | Yeh | 439/330 |
| 7,867,006 B2* | 1/2011 | Yeh | 439/331 |
| 7,878,836 B2* | 2/2011 | Lin et al. | 439/331 |
| 7,963,789 B1* | 6/2011 | French et al. | 439/331 |
| 7,990,718 B2* | 8/2011 | Xia et al. | 361/710 |
| 8,052,451 B2* | 11/2011 | Yeh | 439/331 |
| 8,052,452 B2* | 11/2011 | Yeh et al. | 439/331 |
| 8,081,477 B2* | 12/2011 | Yang et al. | 361/720 |
| 8,137,121 B2* | 3/2012 | Dai | 439/135 |
| 8,192,220 B2* | 6/2012 | Yeh | 439/331 |
| 8,439,693 B2* | 5/2013 | Yeh et al. | 439/135 |
| 8,506,316 B2* | 8/2013 | Tsai et al. | 439/331 |
| 8,693,200 B2* | 4/2014 | Colgan et al. | 361/702 |
| 8,834,191 B2* | 9/2014 | Yeh et al. | 439/331 |
| 2004/0018755 A1* | 1/2004 | Ma | 439/73 |
| 2004/0052055 A1* | 3/2004 | Liu | 361/719 |
| 2004/0250993 A1* | 12/2004 | Ji-Hai et al. | 165/80.3 |
| 2004/0257771 A1* | 12/2004 | Shinotou | 361/704 |
| 2005/0030718 A1* | 2/2005 | Villanueva et al. | 361/710 |
| 2005/0083659 A1* | 4/2005 | Gattuso et al. | 361/704 |
| 2005/0094379 A1* | 5/2005 | Lee et al. | 361/719 |
| 2005/0111191 A1* | 5/2005 | Lee et al. | 361/704 |
| 2005/0111193 A1* | 5/2005 | Lee et al. | 361/704 |
| 2005/0287858 A1* | 12/2005 | Toda et al. | 439/331 |
| 2006/0056152 A1* | 3/2006 | Li et al. | 361/697 |
| 2006/0141840 A1* | 6/2006 | Ma | 439/331 |
| 2006/0291169 A1* | 12/2006 | Lee et al. | 361/704 |
| 2007/0025084 A1* | 2/2007 | Tang | 361/704 |
| 2007/0103870 A1* | 5/2007 | Li et al. | 361/704 |
| 2007/0212917 A1* | 9/2007 | Toda et al. | 439/266 |
| 2007/0230136 A1* | 10/2007 | Chen | 361/719 |
| 2007/0232113 A1* | 10/2007 | Ho | 439/331 |
| 2007/0259543 A1* | 11/2007 | Hsieh | 439/73 |
| 2007/0281534 A1* | 12/2007 | Xu et al. | 439/331 |
| 2007/0297131 A1* | 12/2007 | Hood et al. | 361/687 |
| 2007/0297143 A1* | 12/2007 | Martinson et al. | 361/719 |
| 2008/0174968 A1* | 7/2008 | Feng et al. | 361/720 |
| 2008/0239677 A1* | 10/2008 | Coleman et al. | 361/719 |
| 2008/0280474 A1* | 11/2008 | Fan et al. | 439/266 |
| 2008/0298022 A1* | 12/2008 | Li | 361/710 |
| 2008/0305670 A1* | 12/2008 | Gattuso et al. | 439/342 |
| 2009/0203245 A1* | 8/2009 | Chiang | 439/331 |
| 2009/0257197 A1* | 10/2009 | Yang et al. | 361/720 |
| 2009/0325404 A1* | 12/2009 | Lin et al. | 439/73 |
| 2010/0002396 A1* | 1/2010 | He et al. | 361/709 |
| 2010/0020504 A1* | 1/2010 | Chang | 361/720 |
| 2010/0035458 A1* | 2/2010 | Yeh et al. | 439/345 |
| 2010/0052158 A1* | 3/2010 | Yajima et al. | 257/718 |
| 2010/0053904 A1* | 3/2010 | Chen et al. | 361/720 |
| 2010/0093201 A1* | 4/2010 | Yeh | 439/330 |
| 2010/0120268 A1* | 5/2010 | Yeh | 439/68 |
| 2010/0130030 A1* | 5/2010 | Liao et al. | 439/68 |
| 2010/0130049 A1* | 5/2010 | Yeh et al. | 439/331 |
| 2010/0165580 A1* | 7/2010 | Li et al. | 361/720 |
| 2010/0184308 A1* | 7/2010 | Yeh | 439/65 |
| 2010/0184314 A1* | 7/2010 | Yeh | 439/157 |
| 2010/0259902 A1* | 10/2010 | Xia et al. | 361/720 |
| 2010/0321894 A1* | 12/2010 | Wang et al. | 361/709 |
| 2011/0034052 A1* | 2/2011 | Yeh | 439/259 |
| 2011/0146947 A1* | 6/2011 | Liu et al. | 165/67 |
| 2011/0146960 A1* | 6/2011 | Cao et al. | 165/121 |
| 2011/0149520 A1* | 6/2011 | Yang | 361/709 |
| 2011/0157833 A1* | 6/2011 | Bohannon et al. | 361/709 |
| 2011/0157835 A1* | 6/2011 | Feng et al. | 361/718 |
| 2011/0249404 A1* | 10/2011 | Chiu | 361/704 |
| 2011/0250794 A1* | 10/2011 | Yeh | 439/660 |
| 2011/0294330 A1* | 12/2011 | Dai | 439/331 |
| 2012/0045941 A1* | 2/2012 | Yeh | 439/626 |
| 2012/0156919 A1* | 6/2012 | Yeh et al. | 439/370 |
| 2012/0162923 A1* | 6/2012 | Lee et al. | 361/719 |
| 2012/0327606 A1* | 12/2012 | Tang | 361/720 |
| 2013/0003302 A1* | 1/2013 | Tan et al. | 361/704 |
| 2013/0050946 A1* | 2/2013 | Ma et al. | 361/709 |
| 2013/0078827 A1* | 3/2013 | Yeh et al. | 439/76.1 |
| 2013/0100614 A1* | 4/2013 | Yu et al. | 361/719 |
| 2013/0153190 A1* | 6/2013 | Gan | 165/185 |
| 2013/0155623 A1* | 6/2013 | Ma et al. | 361/720 |
| 2013/0322037 A1* | 12/2013 | Tan et al. | 361/752 |
| 2013/0344713 A1* | 12/2013 | Yeh | 439/68 |

* cited by examiner

RETENTION DEVICE AND ELECTRICAL CONNECTOR ASSEMBLY USED THEREOF

BACKGROUND OF THE INVENTION

1. Field of the Invention

The present invention relates to a retention device and an electrical connector assembly used thereof for connecting with an IC package, and more particularly to a retention device for positioning a heat sink securely.

2. Description of Related Art

A conventional electrical connector for connecting an IC package to a substrate is usually assembled with a heat sink to dissipate the heat generated by the IC package during working. U.S. Pat. No. 6,826,052 issued to Ma on Nov. 30, 2004 discloses a conventional electrical connector for electrically connecting an IC package with a substrate. The electrical connector includes a retention device for fixing a heat sink. The retention device includes a fixing seat and a pair of spring members. The fixing seat is configured to a frame shape and includes four sidewalls extending upwardly. A pair of opposite sidewalls defines a number of holes. Each of the spring members defines a pair of hooks. The hooks receive in the holes and interlocked with the fixing seat, thus the spring members fix the heat sink on the IC package securely. But, it is hard to assemble the spring members to the fixing seat due to it need enough force to do so. At the same time, when use some times, the spring members will has no enough spring, thus the spring members has no enough force exert on the heat sink.

Hence, it is desirable to provide an improved electrical connector to overcome the aforementioned disadvantages.

SUMMARY OF THE INVENTION

Accordingly, an object of the present invention is to provide a retention device with improved structure to be operated easily and securely position the heat sink.

According to one aspect of the present invention, a retention device for positioning a heat sink includes a base, a lever assembled to the base and a pressing tab assembled to the lever, the pressing tab includes a first pushing portion and a second pushing portion for pressing the heat sink, the first pushing portion includes an upper surface being pressed by the lever and a lower surface opposite to the upper surface for pressing the heat sink, the second pushing portion includes a top surface being pressed by the lever and a bottom surface opposite to the top surface for pressing the heat sink, the distance between the upper surface and the lower surface of the first pushing portion is smaller than the distance between the top surface and the bottom surface of the second pushing portion.

Other objects, advantages and novel features of the invention will become more apparent from the following detailed description when taken in conjunction with the accompanying drawings, in which:

DETAILED DESCRIPTION OF THE INVENTION

Reference will now be made to the drawings to describe the present invention in detail.

Figure 1:
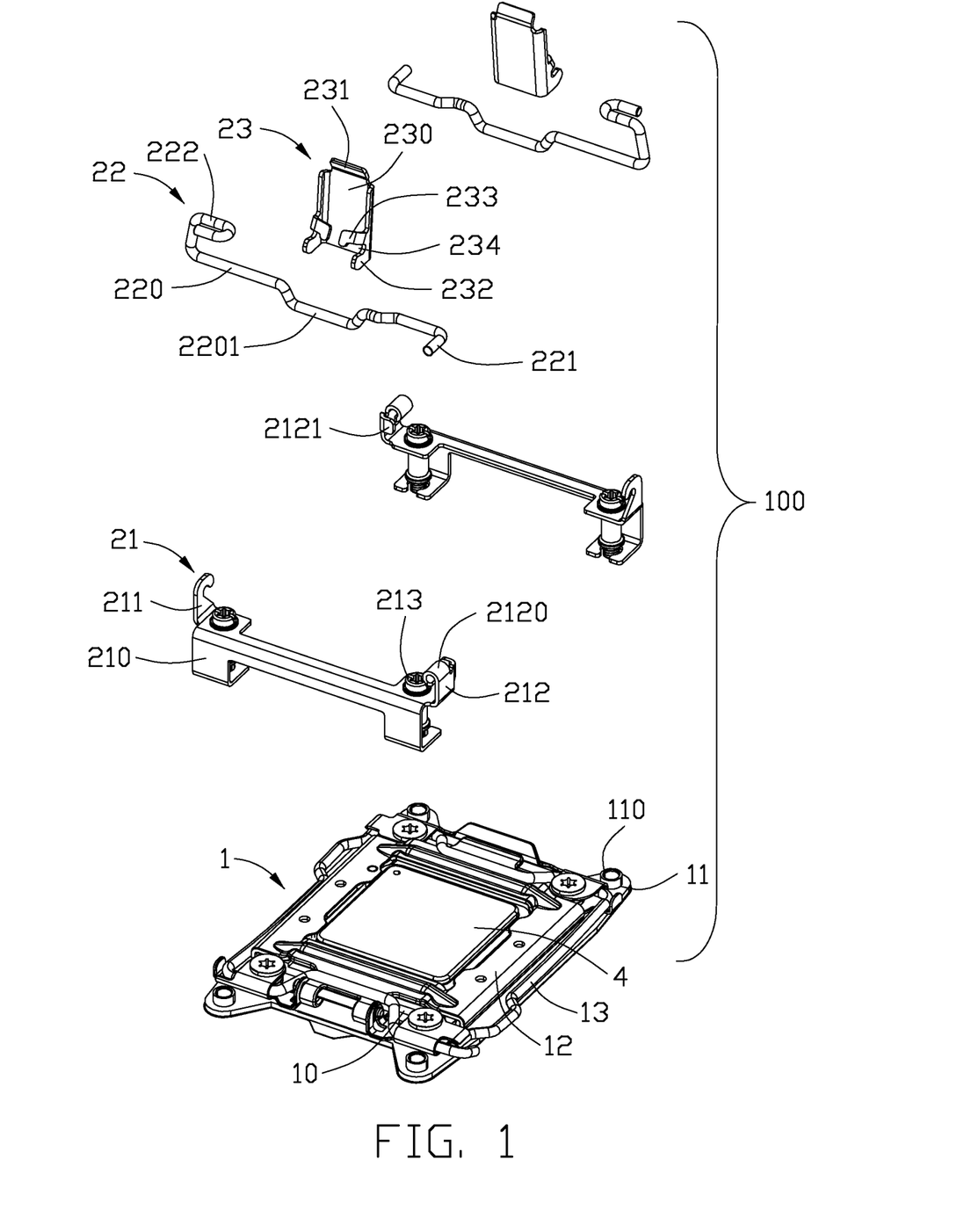
FIG. 1 is an exploded view of an electrical connector assembly according to a preferred embodiment of the present invention.
Figure 2:
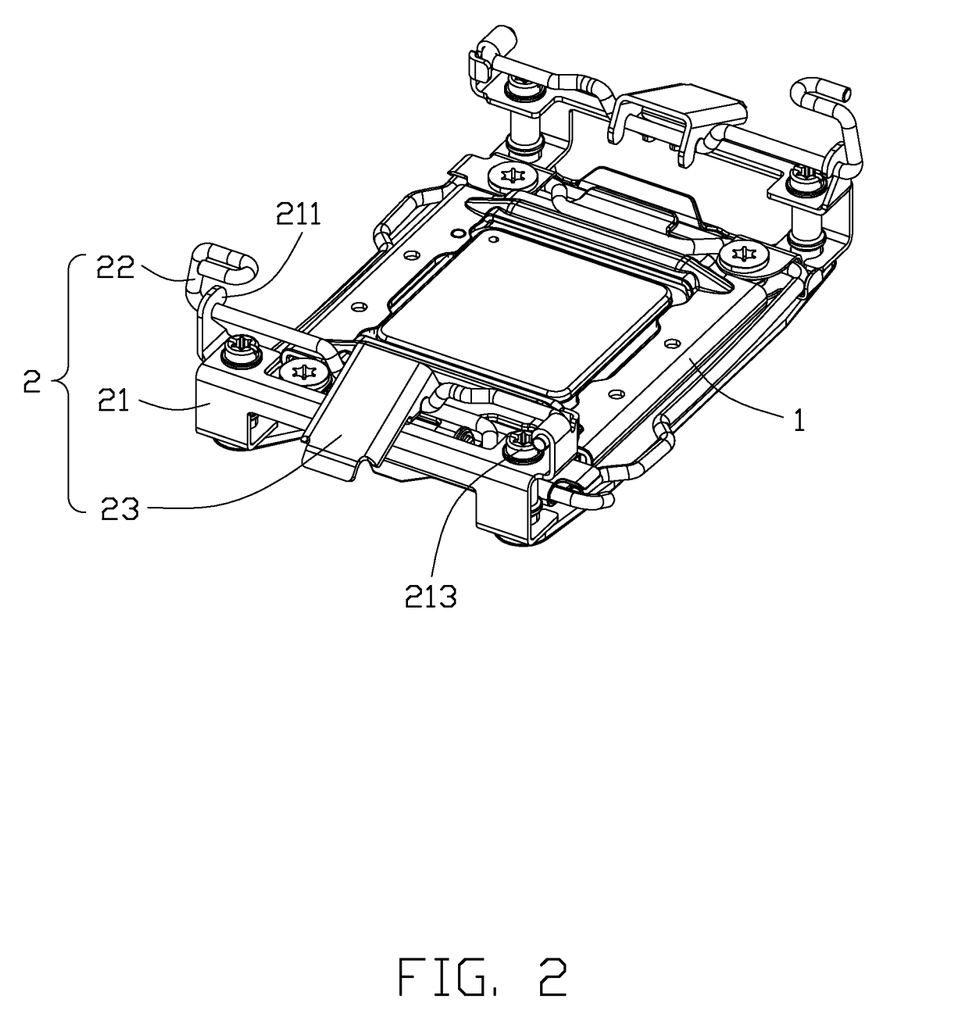
FIG. 2 is an assembled view of the electrical connector assembly as shown in FIG. 1, showing the lever in a closed position.

FIGS. 1 and 2 illustrates an electrical connector assembly 100 in accordance to a preferred embodiment of the present invention, the electrical connector assembly 100 includes an electrical connector 1 and a retention device 2 assembled to one end of the electrical connector 1. The electrical connector 1 is used for electrically connecting an IC package 4 with a substrate (not labeled). The electrical connector 1 comprises an insulative housing 10 with a plurality of electrical contacts (not labeled) received therein, a fixing member 11 locates at one end of the insultive housing 10, a cover 12 pivotally assembled to the fixing member 11 and a pressing member 13 to press the cover 12. The fixing member 11 includes a bottom connecting member 110. In this embodiment, the bottom connecting member 110 is a nut.

The retention device 2 is used for positioning a heat sink 3 on the electrical connector 1. The retention device 2 is fixed to the fixing member 11 through an upper connecting member 213 matching with the bottom connecting member 110. In this embodiment, the upper connecting member 213 is a screw. The retention device 2 includes a base 21 with a U shape, a lever 22 assembled to the base 21 and a pressing tab 23 assembled to the lever 22.

The base 21 includes a body portion 210, a interlock portion 211 extending from one end of the body portion 210, a fastening portion 212 extending from the other end of the body portion 210. The fastening portion 212 includes a receiving portion 2120 and a stop portion 2121 locates on one side of the receiving portion 2120. The lever 22 includes a main portion 220, a shaft portion 221 bending from one end of the main portion 220 and an operation portion 222 bending from the other end of the main portion 220. The lever 22 includes a holding portion 2201 at the middle of the main portion 220 and deviating from the main portion 220.

The pressing tab 23 is assembled to the holding portion 2201 of the lever 22, which ensure the pressing tab 23 locates on the middle of the lever 22, thus can press the middle of the heat sink 3. The pressing tab 23 includes a body portion 230, a first pushing portion 233 and a second pushing portion 232 extending from one end of the body portion 230 and a handing portion 231 extending from another end of the body portion 230. There is a space 234 between the first pushing portion 233 and the second pushing portion 232 for receiving the lever 22.

Figure 5:
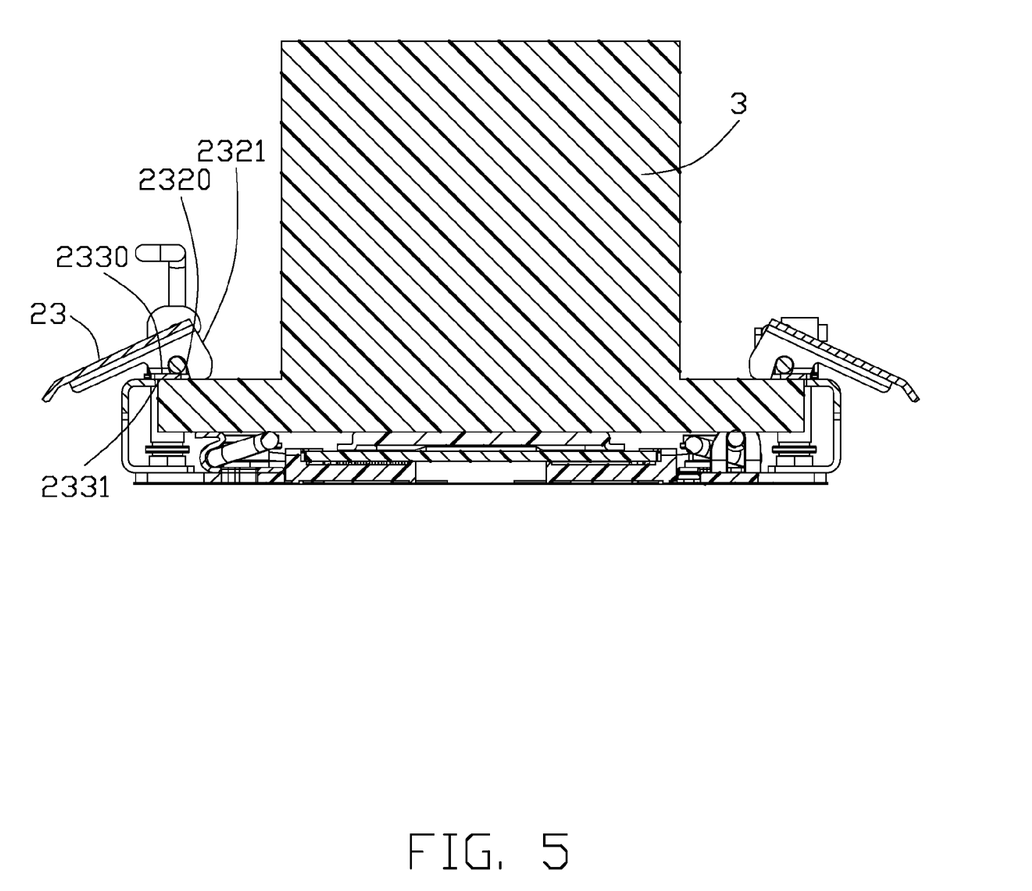
FIG. 5 is a cross-sectional view of the electrical connector assembly along line 5-5 as shown in FIG. 4.

Referring to FIG. 5, the first pushing portion 233 includes an upper surface 2330 and a lower surface 2331 opposite to the upper surface 2330. The second pushing portion 232 includes a top surface 2320 and a bottom surface 2321 opposite to the top surface 2320. The distance between the upper surface 2330 and the lower surface 2331 of the first pushing portion 233 is smaller than the distance between the top surface 2320 and the bottom surface 2321 of the second pushing portion 232.

Figure 6:
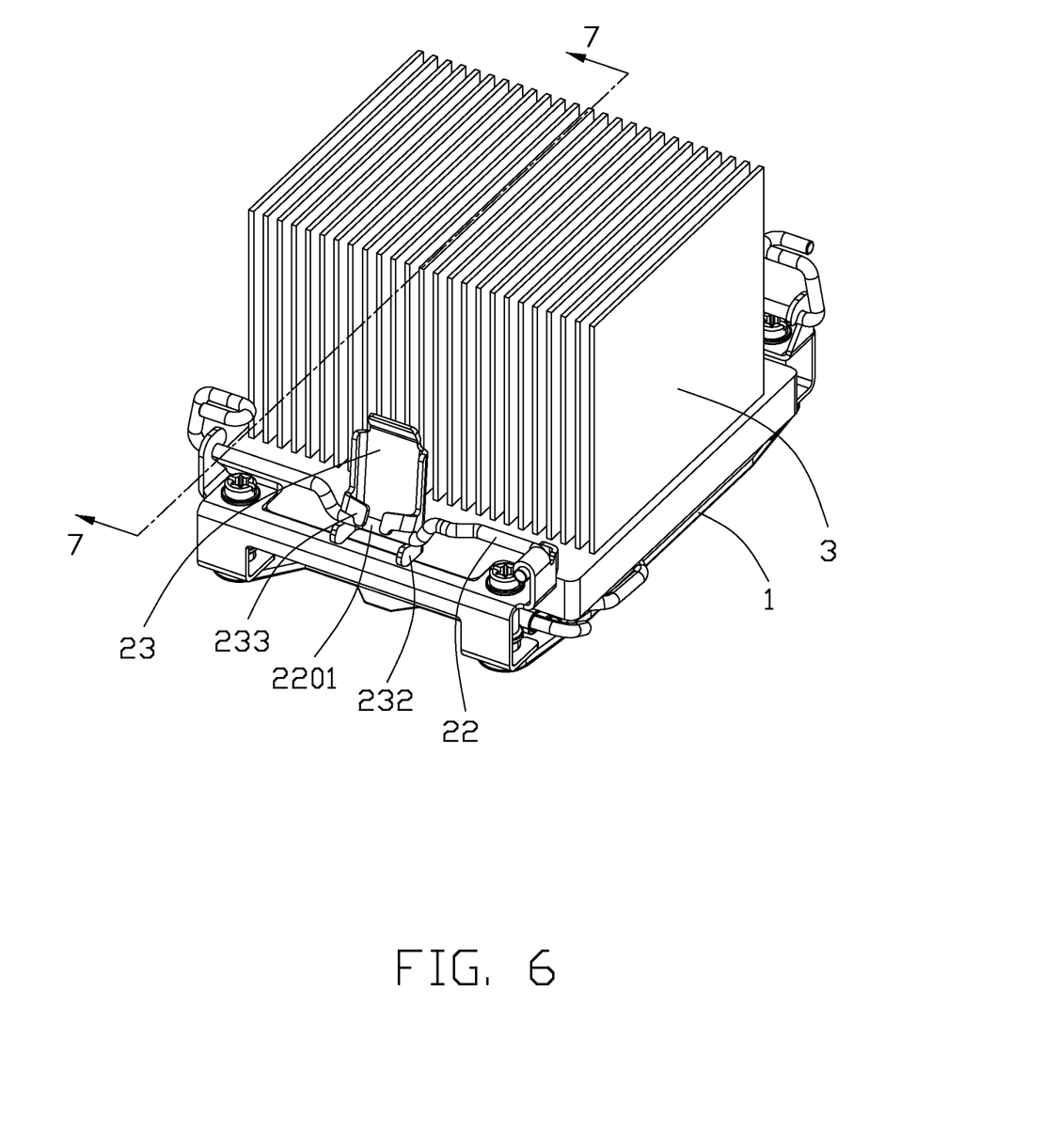
FIG. 6 is similar to FIG. 4, showing the pressing tab in an opened position.
Figure 7:
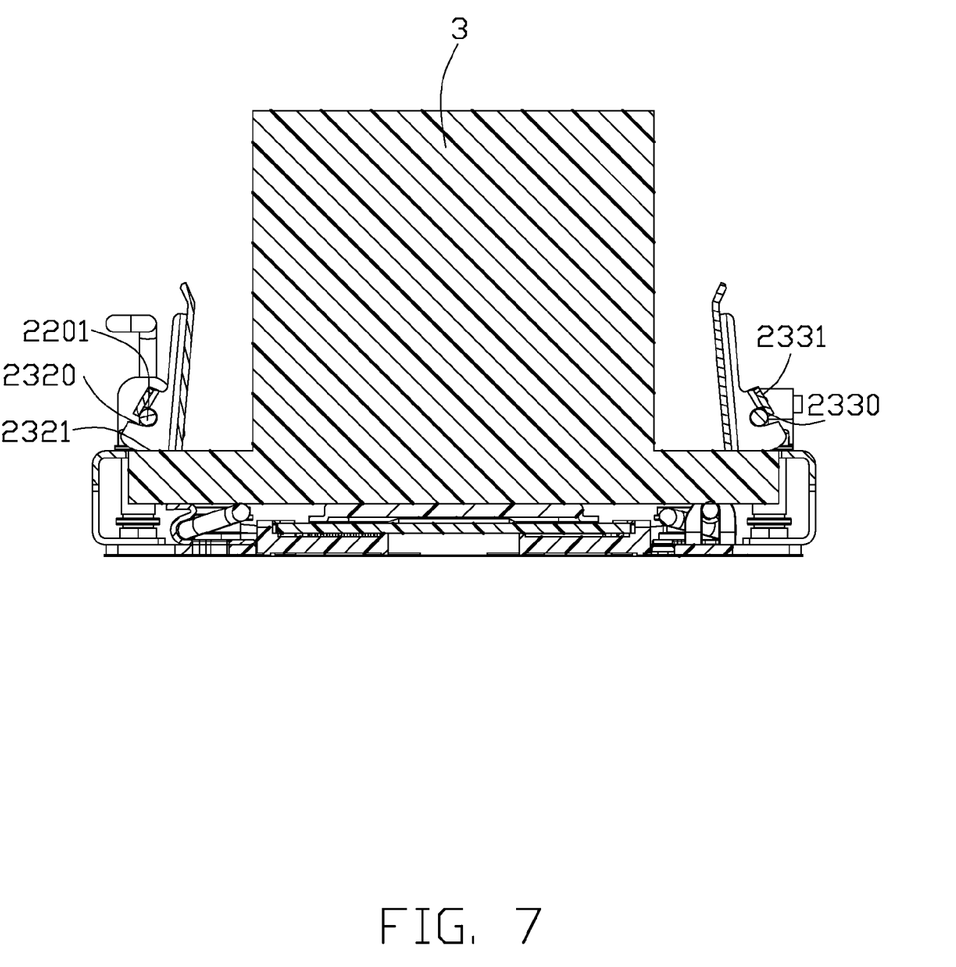
FIG. 7 is a cross-sectional view of the electrical connector assembly along line 7-7 shown in FIG. 6.

Referring to FIG. 5, when the pressing tab 23 is in a first position, the upper surface 2330 of the first pushing portion 233 is pressed by the lever 22, the lower surface 2331 of the first pushing portion 233 press the heat sink 3. Referring to FIG. 6, when the pressing tab 23 is in a second position, the top surface 2320 of the second pushing portion 232 is pressed by the lever 22, the bottom surface 2321 of the second pushing portion 232 press the heat sink 3.

Figure 3:
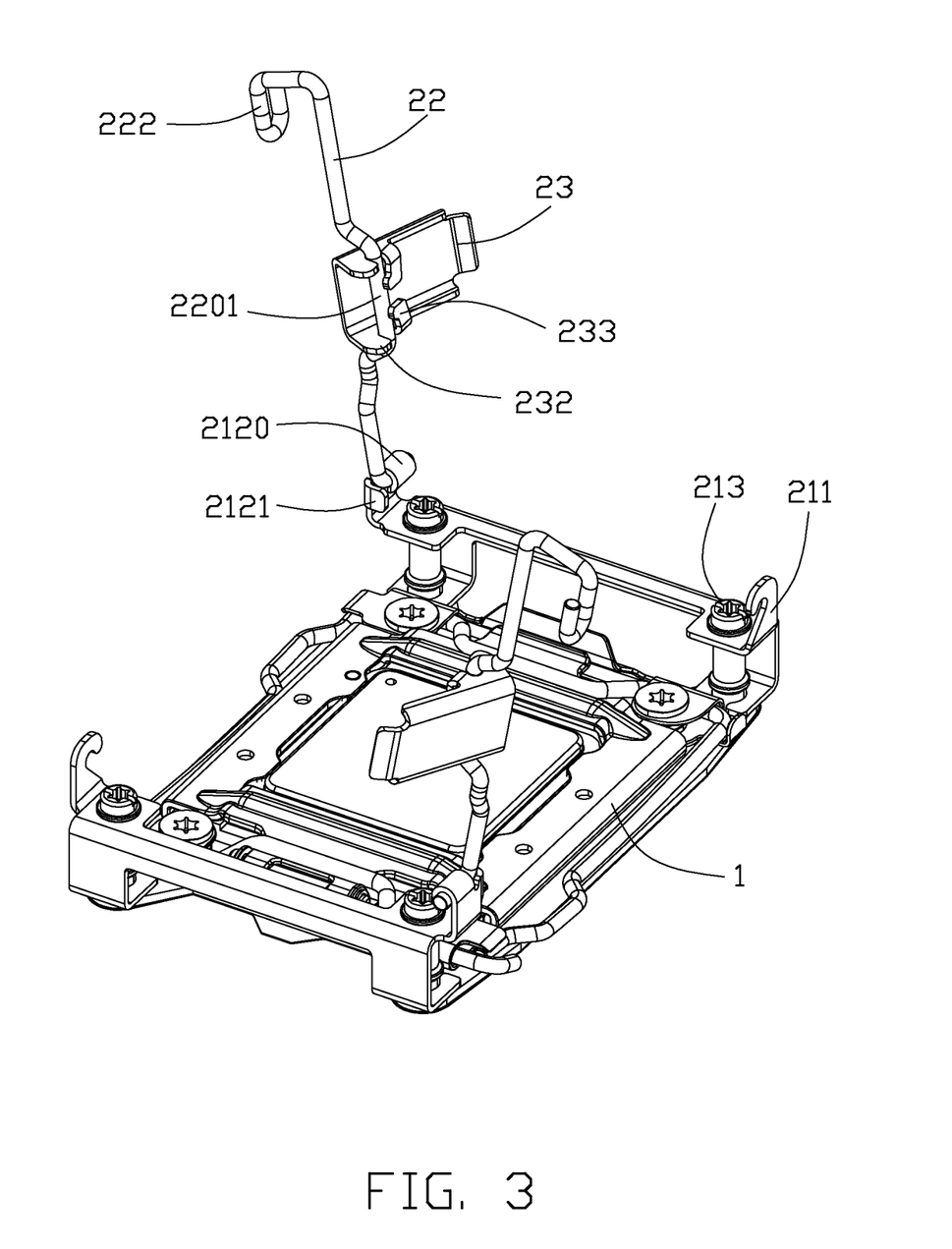
FIG. 3 is similar to FIG. 2, showing the lever in an opened position.
Figure 4:
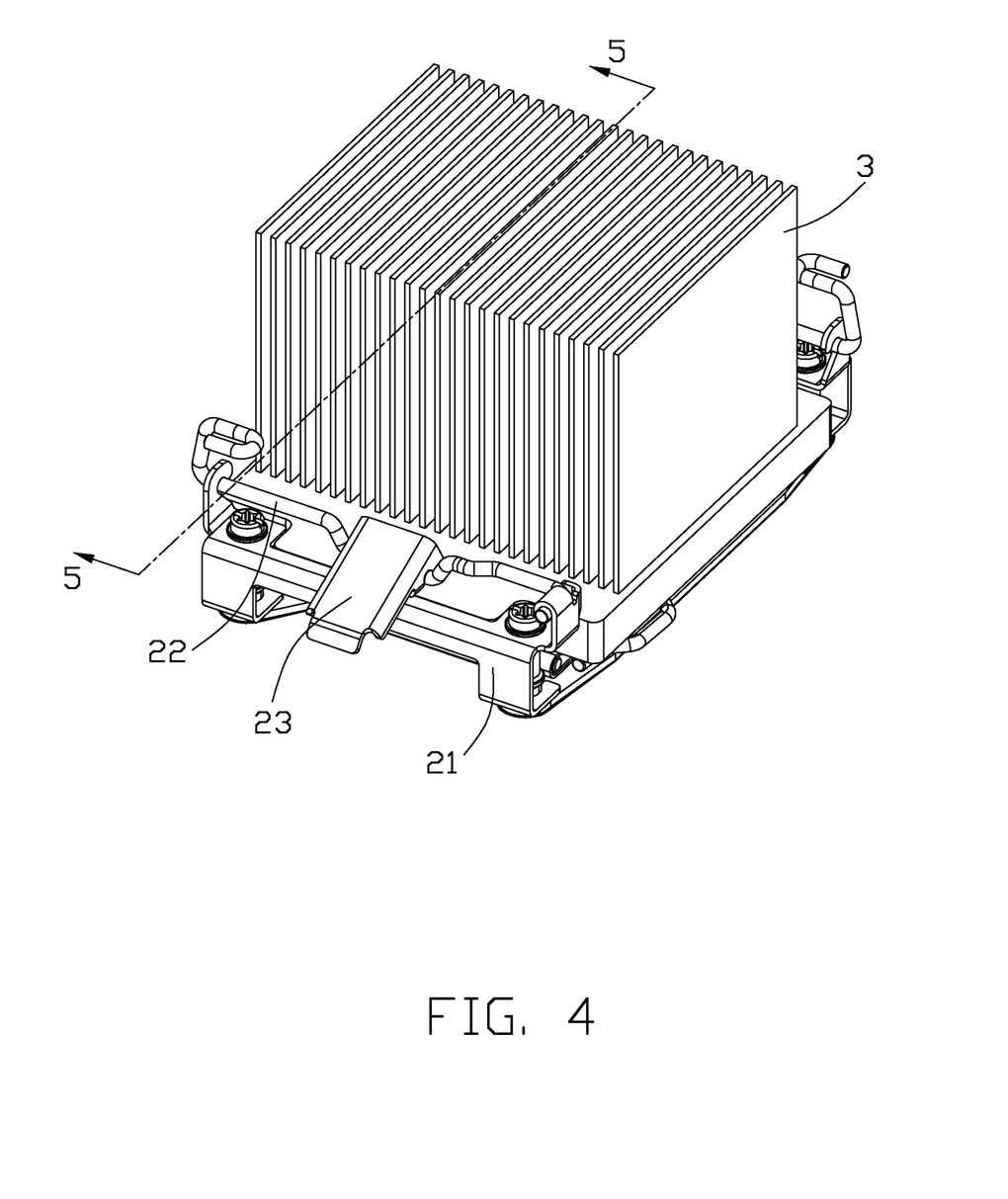
FIG. 4 is assembled view of the electrical connector assembly and a heat sink, showing the pressing tab in an initial position.

Referring to FIGS. 2 and 3, showing the electrical connector assembly 100 after assembled. The retention device 2 is fixed to two opposite ends of the electrical connector 1; the shaft portion 221 of the lever 22 receives in the receiving portion 2120 of the base 21 and is stopped by the stop portion 2121 to position the lever 22 on the base 21; the holding portion 2201 of the lever 22 receives in the space 234 between the first pushing portion 233 and the second pushing portion 232 to position the pressing tab 23 on the lever 22.

Referring to FIG. 3 to FIG. 7, showing the electrical connector assembly 100 is used. Firstly, rotate the lever 22 to an opened position, assemble the heat sink 3 to the electrical connector 1; Secondly, rotate the lever 22 to a closed position, the lever 22 interlocked with the interlock portion 211 of the base 21, the holding portion 2201 of the lever 21 presses the first pushing portion 233, the first pushing portion 233 presses the heat sink 3 to preload of the heat sink 3; Then, rotate the pressing tab 23 to make the holding portion 2201 of the lever 21 press the second pushing portion 232, the second pushing portion 232 press the heat sink 3. Due to the distance between the upper surface 2330 and the lower surface 2331 of the first pushing portion 233 is smaller than the distance between the top surface 2320 and the bottom surface 2321 of the second pushing portion 232, the lever 22 is raised by the second pushing portion 232, thus can exert a stronger force on the heat sink 3.

While the preferred embodiments in accordance with the present invention has been shown and described, equivalent modifications and changes known to persons skilled in the art according to the spirit of the present invention are considered within the scope of the present invention as defined in the appended claims.

What is claimed is:

1. An electrical assembly for positioning a heat sink, comprising:
   an electrical connector; and
   a retention device locating on one end of the electrical connector for positioning the heat sink on the electrical connector, the retention device including a base, a lever assembled to the base and a pressing tab assembled to the lever, the pressing tab includes a first pushing portion and a second pushing portion for pressing the heat sink; wherein
   the first pushing portion includes an upper surface being pressed by the lever and a lower surface opposite to the upper surface for pressing the heat sink, the second pushing portion includes a top surface being pressed by the lever and a bottom surface opposite to the top surface for pressing the heat sink; wherein
   the distance between the upper surface and the lower surface of the first pushing portion is smaller than the distance between the top surface and the bottom surface of the second pushing portion.

2. The electrical assembly as claimed in claim 1, wherein the electrical connector includes a bottom connecting member, the base includes an upper connecting member matched with the bottom connecting member to position the retention device on the electrical connector.

3. The electrical assembly as claimed in claim 2, wherein the electrical connector includes an insulative housing and a fixing member locates on one side of the insulative housing, the bottom connecting member is set on the fixing member.

4. The electrical assembly as claimed in claim 1, wherein the lever includes a main portion, a shaft portion bending from one end of the main portion and an operation portion bending from the other end of the main portion, the lever further includes a holding portion at the middle of the main portion for pressing the first pushing portion/the second pushing portion of the pressing tab.

5. The electrical assembly as claimed in claim 4, wherein the base includes a body portion, an interlock portion extending from one end of the body portion, a fastening portion extending from the other end of the body portion, the fastening portion includes a receiving portion for receiving the shaft portion of the lever, the interlock portion interlocked with the lever.

6. The electrical assembly as claimed in claim 4, wherein the pressing tab includes a space between the first pushing portion and the second pushing portion for receiving the lever.

7. A retention device for positioning a heat sink, comprising:
   a base;
   a lever assembled to the base; and
   a pressing tab assembled to the lever, the pressing tab includes a first pushing portion and a second pushing portion for pressing the heat sink; wherein
   the first pushing portion includes an upper surface being pressed by the lever and a lower surface opposite to the upper surface for pressing the heat sink, the second pushing portion includes a top surface being pressed by the lever and a bottom surface opposite to the top surface for pressing the heat sink; wherein
   the distance between the upper surface and the lower surface of the first pushing portion is smaller than the distance between the top surface and the bottom surface of the second pushing portion.

8. The retention device as claimed in claim 7, wherein the lever includes a main portion, a shaft portion bending from one end of the main portion and an operation portion bending from the other end of the main portion, the lever further includes a holding portion at the middle of the main portion for pressing the first pushing portion/the second pushing portion of the pressing tab.

9. The retention device as claimed in claim 8, wherein the base includes a body portion, an interlock portion extending from one end of the body portion, a fastening portion extending from the other end of the body portion, the fastening portion includes a receiving portion for receiving the shaft portion of the lever, the interlock portion interlocked with the lever.

10. The electrical connector as claimed in claim 8, wherein the pressing tab includes a space between the first pushing portion and the second pushing portion for receiving the lever.

11. An electrical connector assembly comprising:
    an electrical connector;
    a heat sink positioned upon the electrical connector;
    a retention device including:
    a base around one end of the connector;
    a lever rotatably mounted to said base in an associative manner; and
    a pressing tab mounted upon a main shaft of the lever and moveable between a high tensioned position where the pressing tab applies great downward forces upon the heat sink, and a lower tensioned position wherein said pressing tab applies less or zero downward forces upon the heat sink; wherein said lever is moveable between an open position where the heat sink can be mounted upon the connector without obstruction, and a closed position where the heat sink is restrained during loading/unloading the heat sink with regard to the connector.

12. The electrical connector assembly as claimed in claim 11, wherein a rotation axis about which said lever is rotated with regard to the base, extends in first a direction which is perpendicular to a second direction along which the main shaft of the lever extends.

13. The electrical connector assembly as claimed in claim 11, wherein said pressing tab is pivotally mounted upon the main shaft of the lever.

14. The electrical connector assembly as claimed in claim 13, wherein in a top view, the pressing tab is located within a contour of the base in the high tensioned position while extending beyond the contour of the base in the lower tensioned position.

* * * * *